United States Patent
Crain, Jr. et al.

(10) Patent No.: US 8,963,553 B2
(45) Date of Patent: Feb. 24, 2015

(54) SYSTEMS AND METHODS FOR USE IN DETERMINING HAZARDOUS CHARGING CONDITIONS

(71) Applicant: The Aerospace Corporation, El Segundo, CA (US)

(72) Inventors: William R. Crain, Jr., Manhattan Beach, CA (US); Wayne E. Kooker, Camarillo, CA (US); Dan J. Mabry, El Segundo, CA (US); Susan Crain, Manhattan Beach, CA (US); James L. Roeder, Redondo Beach, CA (US); Joseph F. Fennell, Torrance, CA (US); Joseph E. Mazur, Bristow, VA (US)

(73) Assignee: The Aerospace Corporation, El Segundo, CA (US)

( * ) Notice: Subject to any disclaimer, the term of this patent is extended or adjusted under 35 U.S.C. 154(b) by 260 days.

(21) Appl. No.: 13/661,280

(22) Filed: Oct. 26, 2012

(65) Prior Publication Data
US 2014/0118008 A1    May 1, 2014

(51) Int. Cl.
*G01R 29/12* (2006.01)
(52) U.S. Cl.
USPC .......................................... 324/457; 324/72
(58) Field of Classification Search
USPC ........................................ 324/457, 649, 72
See application file for complete search history.

(56) References Cited

U.S. PATENT DOCUMENTS

| | | | |
|---|---|---|---|
| 5,315,255 A | 5/1994 | Bettinger | |
| 5,903,220 A | 5/1999 | Jon et al. | |
| 6,144,341 A | 11/2000 | Kraz | |
| 6,563,319 B1 | 5/2003 | Kraz | |
| 6,987,654 B2 | 1/2006 | Levinzon | |
| 7,525,316 B2 | 4/2009 | Kraz | |
| 7,795,875 B2 | 9/2010 | Kraz | |
| 2012/0072139 A1 | 3/2012 | Reed et al. | |
| 2013/0193978 A1* | 8/2013 | Woolley et al. | 324/457 |

OTHER PUBLICATIONS

Koons, H. C. et al., "Spatial and Temporal Correlation of Spacecraft Surface Charging in Geosynchronous Orbit," Journal of Spacecraft and Rockets, Jan.-Feb. 2006, pp. 178-185, vol. 43, No. 1, AIAA, Reston, VA.

(Continued)

*Primary Examiner* — Vincent Q Nguyen
(74) *Attorney, Agent, or Firm* — Manita Rawat; Duane Morris LLP (57) ABSTRACT

A charge detection device includes a dielectric member, a base plate coupled to the dielectric member, and a processing unit coupled to the plate. The dielectric member is representative of at least one material on a location of a vessel and the dielectric member induces an electrostatic potential energy when charged. The plate channels the induced energy through at least a portion of the device. The plate further receives at least one signal that is representative of an electrostatic discharge from a different location of the vessel. The processing unit generates at least one first output of a measurement for the induced energy. The processing unit further generates at least one second output of the presence of the electrostatic discharge to facilitate a correlation between the first and second outputs such that a user is enabled to determine the presence of at least one hazardous charging condition on the vessel.

20 Claims, 5 Drawing Sheets

(56) References Cited

OTHER PUBLICATIONS

Bogorad, A. et al., "Integrated Environmental Monitoring System for Spacecraft," IEEE Transactions on Nuclear Science, Dec. 1995, vol. 43, No. 6, IEEE Nuclear and Plasma Sciences Society.

Koons, H. C. et al., "The Impact of the Space Environment on Space Systems," 6th Spacecraft Charging Technology Conference, Sep. 2000, AFRL-VS-TR, 20001578.

* cited by examiner

SYSTEMS AND METHODS FOR USE IN DETERMINING HAZARDOUS CHARGING CONDITIONS

BACKGROUND

The field of the invention relates generally to monitoring systems and, more particularly, to systems and methods for use in determining hazardous charging conditions.

At least some known vessels, such as aircrafts and spacecrafts, may encounter surface and/or internal charging from a surrounding atmospheric or space environment. For example, surface charging may result from charge buildup with dielectric materials located on the exterior surfaces of the vessel. Such surface and internal charging may create operational risks to the vessel, as the induced charging may be from hundreds to several thousand volts. Moreover, electromagnetic emissions resulting from the abrupt electrical discharge of such materials can be large enough to disrupt and even damage electronic equipment that may be onboard the vessel. Accordingly, it is important to detect or at least characterize such hazardous charging conditions.

At least some known scientific payloads include instruments designed to measure charge buildup and/or detect electrostatic discharge events. However, such instruments are generally large in size and can be quite expensive to use. As a result, the use of such instruments may be limited. Instead, anomaly resolution and adjustments to at least some known spacecraft operations are based on environmental measurements from a few spacecrafts that have specialized sensors. However, such measurements have substantially large attendant uncertainties because of the highly localized nature of the charging environment. Moreover, while at least some known systems are able to detect electrostatic discharge transients, known systems do not include a transient waveform recorder that can be used to identify the source or type of electromagnetic interference detected.

BRIEF DESCRIPTION

In one embodiment, a charge detection device is provided, wherein the charge detection device includes a dielectric member, a base plate coupled to the dielectric member, and a processing unit coupled to the base plate. The dielectric member is representative of at least one material on a first location of a vessel and the dielectric member is configured to induce electrostatic potential energy when it is charged. The base plate is configured to channel the induced electrostatic potential energy through at least a portion of the charge detection device. The base plate is further configured to receive at least one signal that is representative of an electrostatic discharge from a second location of the vessel. The processing unit is configured to generate at least one first output that is representative of a measurement for the induced electrostatic potential energy. The processing unit is further configured to generate at least one second output that is representative of the presence of the electrostatic discharge from the second location to facilitate a correlation between the first output and the second output such that a user is enabled to determine the presence of at least one hazardous charging condition on the vessel.

In another embodiment, a monitoring system is provided. The monitoring system includes a vessel and a charge detection device that is coupled to a surface of the vessel. The charge detection device includes a dielectric member, a base plate coupled to the dielectric member, and a processing unit coupled to the base plate. The dielectric member is representative of at least one material on a first location of a vessel and the dielectric member is configured to induce electrostatic potential energy when it is charged. The base plate is configured to channel the induced electrostatic potential energy through at least a portion of the charge detection device. The base plate is further configured to receive at least one signal that is representative of an electrostatic discharge from a second location of the vessel. The processing unit is configured to generate at least one first output that is representative of a measurement for the induced electrostatic potential energy. The processing unit is further configured to generate at least one second output that is representative of the presence of the electrostatic discharge from the second location to facilitate a correlation between the first output and the second output such that a user is enabled to determine the presence of at least one hazardous charging condition on the vessel. The monitoring system also includes a computing device that is coupled to the charge detection device, wherein the computing device includes a presentation interface to display the first and/or second outputs to the user.

In yet another embodiment, a method for determining hazardous charging conditions is provided. Electrostatic potential energy is induced on a dielectric member that is representative of at least one material on a first location of a vessel. The induced electrostatic potential energy is channeled through a base plate that is coupled to the dielectric member. At least one signal that is representative of an electrostatic discharge from a second location of the vessel is received by the base plate. At least one first output that is representative of a measurement for the induced electrostatic potential energy is generated via a processing unit. At least one second output that is representative of the presence of the electrostatic discharge from the second location is generated via the processing unit. A correlation between the first output and the second output is used to determine the presence of at least one hazardous charging condition on the vessel.

DETAILED DESCRIPTION

The exemplary systems and methods described herein overcome at least some known disadvantages associated with at least some known monitoring systems that are used for detecting and/or analyzing hazardous charging conditions for vessels, such as spacecrafts. More specifically, the embodiments described herein provide a charge detection device that can be coupled to a surface of a vessel to measure an induced electrostatic potential energy from a dielectric member that is representative of at least one material used on the vessel, while also being able to determine the presence of an electrostatic discharge from a different location on the vessel. Output(s) associated with the measurement of the induced electrostatic potential energy and of the presence of the electrostatic discharge can be correlated to enable a user to determine the presence of at least one hazardous charging condition on the vessel. As such, the charge detection device enables the use of a single instrument or apparatus to both monitor the charging environment relative to a vessel and to record electrostatic discharge events. Moreover, the charge detection device is physically smaller than known detection devices and can be easily coupled to, and/or removed from, the vessel.

Figure 1:
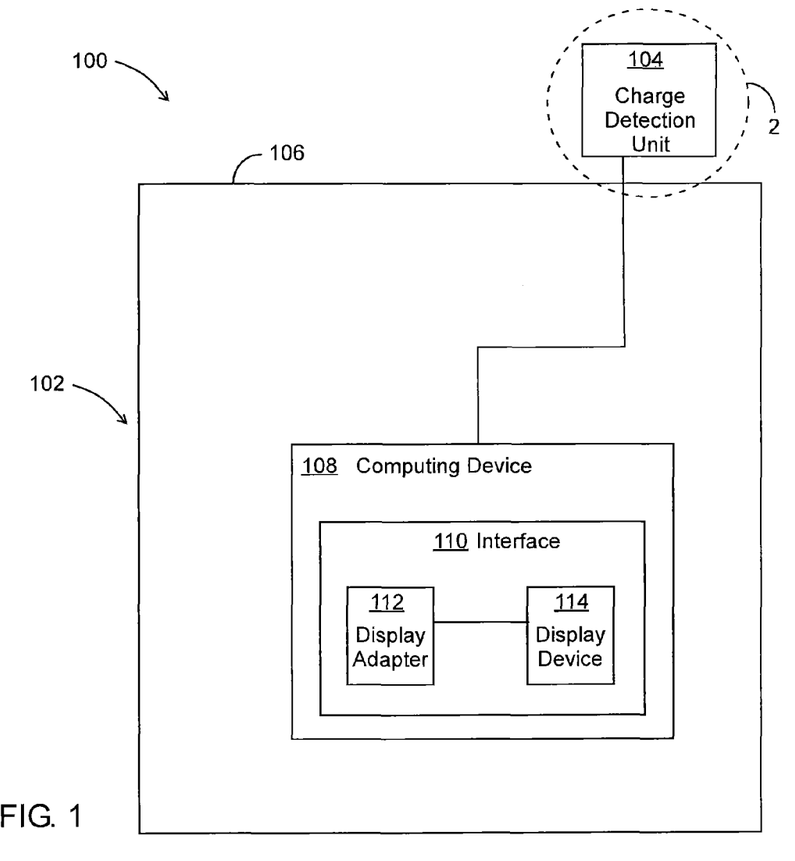
FIG. 1 is a block diagram of an exemplary monitoring system that may be used to determine hazardous charging conditions.

FIG. 1 is a block diagram of an exemplary monitoring system 100 that may be used for detecting and/or analyzing hazardous charging conditions on a vessel 102. While the exemplary embodiment illustrates a vessel, the present disclosure is not limited to vessels. System 100 may include, for example, a stationary structure in lieu of vessel 102. Moreover, in the exemplary embodiment, vessel 102 is a spacecraft. However, one of ordinary skill in the art will appreciate that the present disclosure is not limited to spacecrafts. For example, vessel 102 may be an aircraft or a launch vehicle.

In the exemplary embodiment, a charge detection device 104 is coupled to vessel 102. More specifically, charge detection device 104 is coupled to an exterior surface 106 of vessel 102. Alternatively, charge detection device 104 may be coupled to any other portion of vessel 102 that enables monitoring system 100 to function as described herein. In the exemplary embodiment, and as explained in more detail below, charge detection device 104 is configured to both monitor the charging environment relative to vessel 102 and to record electrostatic discharge events. A computing device 108 is coupled to charge detection device 104. Various connections may be available between computing device 108 and charge detection device 104, including but not limited to a low-level serial data connection, such as Recommended Standard (RS) 232 or RS-485, a high-level serial data connection, such as Universal Serial Bus (USB) or Institute of Electrical and Electronics Engineers (IEEE®) 1394, a parallel data connection, such as IEEE® 1284 or IEEE® 488, a short-range wireless communication channel such as BLUETOOTH®, and/or a private (e.g., inaccessible system) network connection, whether wired or wireless. IEEE is a registered trademark of the Institute of Electrical and Electronics Engineers, Inc., of New York, N.Y. BLUETOOTH is a registered trademark of Bluetooth SIG, Inc. of Kirkland, Wash. It should be noted that, as used herein, the term "couple" is not limited to a direct mechanical and/or an electrical connection between components, but may also include an indirect mechanical and/or electrical connection between multiple components.

In the exemplary embodiment, computing device 108 is configured to display the output(s) generated by charge detection device 104 to a user. More specifically, computing device 108 includes a presentation interface 110 that includes a display adapter 112 that is coupled to at least one display device 114. Display device 114, in the exemplary embodiment, is a visual display device, such as a cathode ray tube (CRT), a liquid crystal display (LCD), an organic LED (OLED) display, and/or an "electronic ink" display. For example, display device 114 may display a graphical and/or textual display of the output(s). Alternatively, presentation interface 110 may include an audio output device (e.g., an audio adapter and/or a speaker) (not shown) and/or a printer (not shown).

Moreover, in the exemplary embodiment, computing device 108 is within vessel 102. Alternatively, computing device 108 may be external to vessel 102. For example, computing device 108 may be positioned in a ground station (not shown) that is remote from vessel 102, wherein the ground station is configured to telecommute with vessel 102.

During operation, in the exemplary embodiment, when vessel 102 is traveling, charge detection device 104 monitors the charging environment relative to vessel 102 and also records electrostatic discharge events. As described in more detail below, charge detection device 104 induces electrostatic potential energy on a dielectric member (not shown in FIG. 1) that is representative of a material on a location of vessel 102. Charge detection device 104 also receives at least one signal that is representative of an electrostatic discharge from another location of vessel 102. In the exemplary embodiment, charge detection device 104 then generates at least one first output that is representative of a measurement for the induced electrostatic potential energy, and charge detection device 104 also generates at least one second output that is representative of the presence of the electrostatic discharge from the other location of vessel 102.

Signal(s) representative of the first and second outputs may then be transmitted to computing device 108 such that the first and second outputs may be displayed to a user. The display of the output(s) enables a correlation and analysis of the outputs such that a user may determine the presence of at least one hazardous charging condition for vessel 102. As such, charge detection device 104 facilitates both a detection of electrostatic discharge transients and an identification of a source or type of electromagnetic interference.

Figure 2:
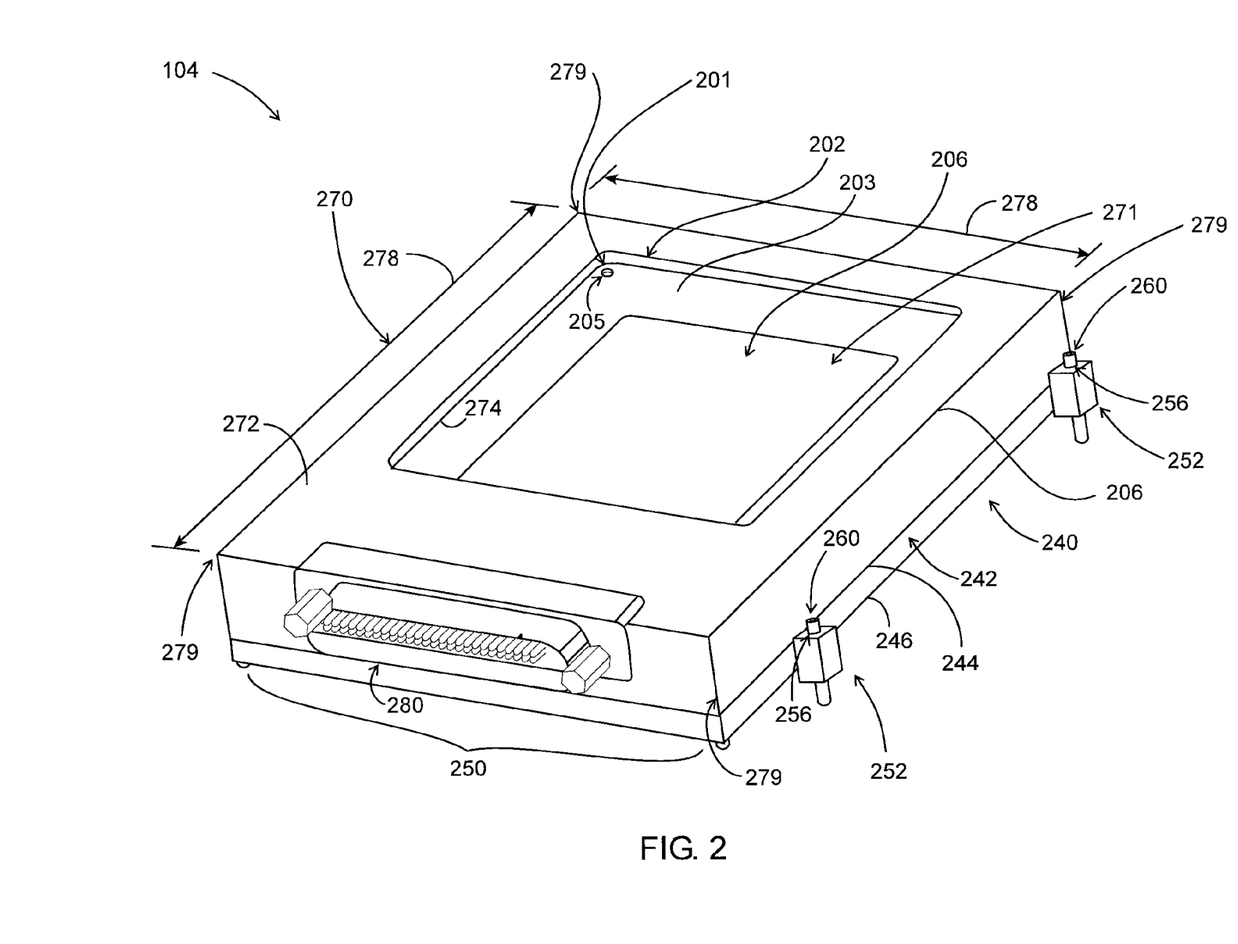
FIG. 2 is a schematic of a perspective view of an exemplary charge detection device that may be used with the monitoring system shown in FIG. 1 and taken from area 2.
Figure 3:
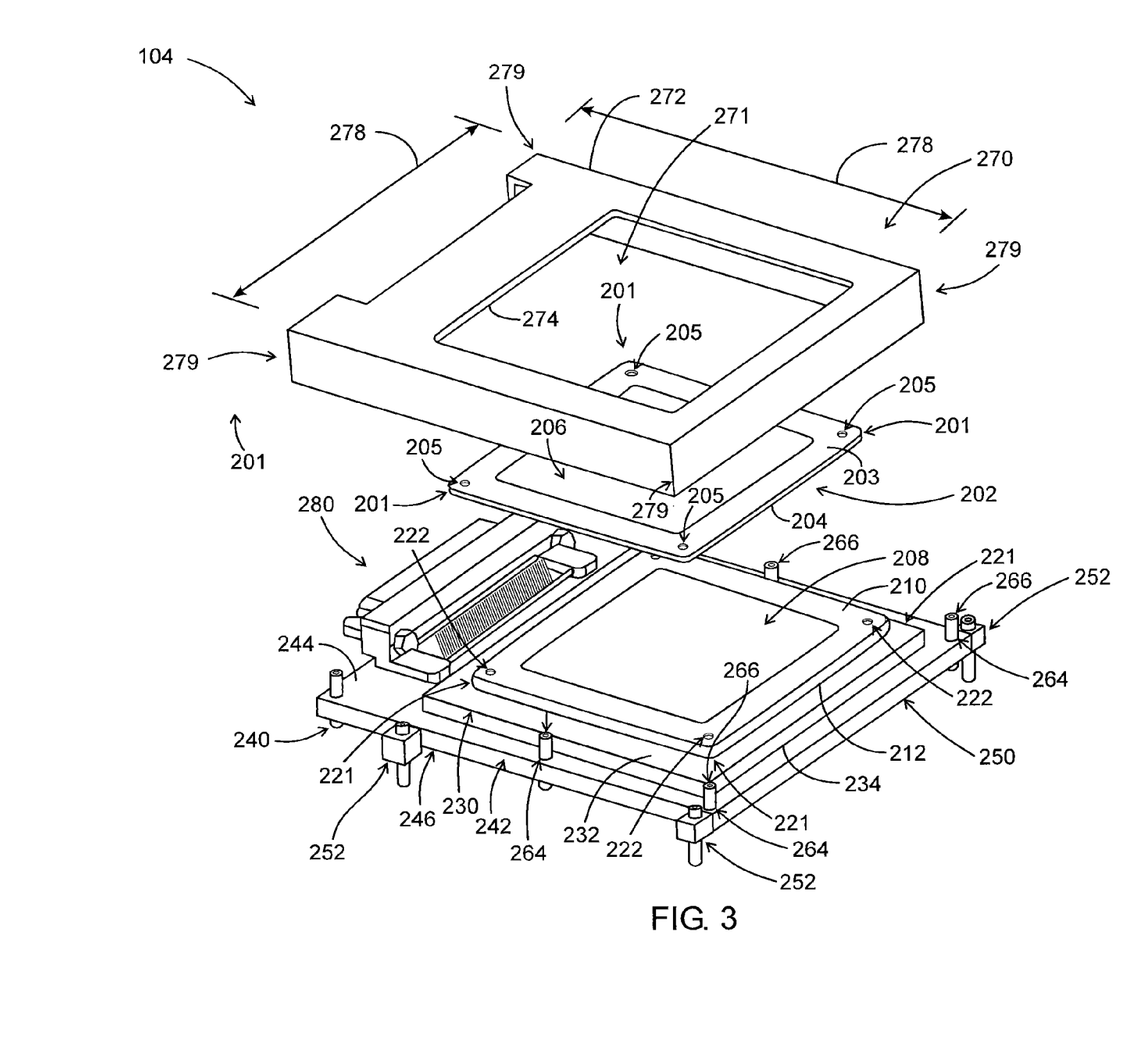
FIG. 3 is a schematic of an exploded view of the charge detection device shown in FIG. 2.

FIG. 2 is a perspective view of charge detection device 104 taken from area 2 (shown in FIG. 1). FIG. 3 is a schematic of an exploded view of charge detection device 104. In the exemplary embodiment, charge detection device 104 includes a charge plate 202 that is fabricated from a conductive material, such as a transition metal. Charge plate 202 includes a first surface 203 and a second surface 204. Further, in the exemplary embodiment, charge plate 202 is substantially square-shaped, and each corner 201 of charge plate 202 is substantially rounded. Alternatively, charge plate 202 may have any other suitable shape that enables device 104 and/or system 100 (shown in FIG. 1) to function as described herein. Moreover, charge plate 202 includes an opening 205 defined at each corner 201, wherein each opening 205 extends from charge plate first surface 203 through charge plate second surface 204.

Charge detection device 104 also includes a dielectric member 206 that is coupled to charge plate 202. More specifically, in the exemplary embodiment, dielectric member 206 may be applied or adhered onto at least a portion of charge plate first surface 203 using any suitable process known in the art. In the exemplary embodiment, dielectric member 206 is substantially square-shaped. Alternatively, dielectric member 206 may have any shape that enables device 104 and/or system 100 to function as described herein. Further, one or more types of dielectric materials may be used to fabricate dielectric member 206, wherein the materials are selected based on suitability, dimensional stability, cost, and/or other characteristic of the material(s). More specifically, in the exemplary embodiment, dielectric member 206 is selected from a material that is representative of at least one material used on vessel 102 (shown in FIG. 1) at, for example, a specific location. For example, dielectric member 206 may be a polyimide film, such as Kapton®, or a glass epoxy laminate. Kapton is a registered trademark of E.I. du Pont de Nemours and Company (DuPont) of Wilmington, Del. Dielectric member 206 may also be a thermal control paint, such as Z306 paint. In the exemplary embodiment, dielectric member 206 may be charged such that dielectric member 206 may induce electrostatic potential energy.

Moreover, in the exemplary embodiment, charge detection device 104 includes a base plate 208 coupled to charge plate 202 and to dielectric member 206. More specifically, in the exemplary embodiment, base plate 208 includes a first surface 210 and a second surface 212, wherein charge plate 202 is coupled to base plate 208 such that charge plate second surface 204 is adjacent to base plate first surface 210. In the exemplary embodiment, base plate 208 is substantially square-shaped and is sized substantially similar to the shape of and size of charge plate 202. Moreover, each corner 221 of base plate 208 is also substantially rounded. Since corners 201 of charge plate 202 and corners 221 of base plate 208 are substantially rounded, electric fields within corners 201 and 221 may be reduced to facilitate preventing unwanted breakdown of any induced electrostatic potential energy.

In the exemplary embodiment, base plate 208 also includes an opening 222 defined at each corner 221 such that charge plate openings 205 are substantially concentrically aligned with base plate openings 222 when charge plate 202 is positioned adjacent to base plate 208. Fasteners (not shown), such as screws or bolts may be used to couple or decouple charge plate 202 from base plate 208. For example, the fasteners may extend through openings 205 and 222 to securely couple charge plate 202 to base plate 208 during use. The fasteners may be removed to remove charge plate 202 from base plate 208 such that a different charge plate (not shown) with a different dielectric member (not shown) may be selectively coupled to base plate 208. Accordingly, the entire charge detection device 104 is not required to be removed or replaced depending on the type of dielectric material that a user desires to use.

In the exemplary embodiment, base plate 208 is an electrode that is configured to channel the induced electrostatic potential energy through at least a portion of charge detection device 104. Moreover, base plate 208 is also an antenna that is configured to receive at least one signal that is representative of an electrostatic discharge from at least a different location of vessel 102. In the exemplary embodiment, base plate 208 may be manufactured from any suitable conductive material that is enabled to channel currents or charge signal(s) therethrough, such as, for example, a metal.

Charge detection device 104 also includes a ceramic substrate member 230 having a relatively high dielectric constant coupled to base plate 208. In the exemplary embodiment, substrate member 230 includes a first surface 232 and a second surface 234, wherein substrate member 230 is coupled to base plate 208 such that base plate second surface 212 is adjacent to substrate member first surface 232. In the exemplary embodiment, surface 232 and/or surface 234 is at least partially plated with a conductive material, such as gold. Alternatively, surface 232 and/or surface 234 may be plated with, and/or fabricated from, any other suitable material that enables device 104 and/or system 100 to function as described herein. In the exemplary embodiment, substrate member 230 may be configured to receive the induced electrostatic potential energy and/or signal(s) that are representative of an electrostatic discharge from base plate 208. Moreover, substrate member 230 is configured to be an insulator such that additional isolators (not shown) may not be required.

A processing unit 240 is coupled to substrate member 230 to enable substrate member 230 to transmit the induced electrostatic potential energy and/or signal(s) that are representative of an electrostatic discharge to processing unit 240. As described in more detail below, processing unit 240 is configured to generate at least one first output that is representative of a measurement for the induced electrostatic potential energy and processing unit 240 is further configured to generate at least one second output that is representative of the presence of the electrostatic discharge.

In the exemplary embodiment, a housing 242 substantially encloses processing unit 240 therein. Moreover, in the exemplary embodiment, housing 242 includes a first surface 244 and a second surface 246. When housing 242 is coupled to substrate member 230, housing first surface 244 is adjacent to substrate member second surface 234 such that a seal is formed between housing first surface 244 and substrate member second surface 234. More specifically, a dry gas seal is formed to facilitate preventing components of processing unit 240 from being exposed to, for example, moisture and/or particulate contamination. In the exemplary embodiment, housing 242 may be welded to substrate member 230. Alternatively, housing 242 may be coupled to substrate member 230 via any suitable manner known in the art that enables device 104 and/or system 100 to function as described herein. Moreover, charge detection device 104 may also include a cover (not shown) that is positioned on second surface 246 of housing 242. More specifically, the cover may be welded onto second surface 246 of housing 242, wherein the cover facilitates exposing the circuitry of processing unit 240 for various applications, such as assembly, wire-bonding, and testing.

Moreover, in the exemplary embodiment, housing 242 is configured to reduce unwanted electromagnetic radio frequency emissions from charge detection device 104. Housing 242 may be formed via a variety of manufacturing processes known in the art, such as, but not limited to, a molding process, a drawing process or a machining process. One or more types of materials may be used to fabricate housing 242 with the materials selected based on suitability for one or more manufacturing techniques, dimensional stability, cost, moldability, workability, rigidity, and/or other characteristic of the material(s). For example, housing 242 may be fabricated from any suitable metal.

Housing second surface 246 is configured to be adjacent to exterior surface 106 (shown in FIG. 1) of vessel 102. In the exemplary embodiment, housing 242 includes a main body portion 250 and a plurality of coupling portions 252 that extend outwardly from main body portion 250. Each coupling portion 252 includes an opening 256 that extends from housing first surface 244 through housing second surface 246. Charge detection device 104 includes a plurality of first fasteners 260. Each opening 256 is sized to receive one first fastener 260 therein. In the exemplary embodiment, first fasteners 260 are bolts that facilitate securely coupling charge detection device 104 to vessel surface 106.

Housing main body portion 250 includes a plurality of openings 264 that extend from housing first surface 244 through housing second surface 246. A plurality of second fasteners 266 are positioned within second openings 264, and second fasteners 266 extend outwardly from housing first surface 244 such that second fasteners 266 are substantially perpendicular with respect to housing first surface 244. Charge detection device 104 also includes a cover 270 that is configured to couple to housing first surface 244 via second fasteners 266. More specifically, in the exemplary embodiment, cover 270 includes a first surface 272 and a second surface 274 that includes a plurality of openings (not shown) that are sized to receive second fasteners 266 therein such that cover 270 may be securely coupled to housing 242.

In the exemplary embodiment, cover 270 is a plasma shield that is configured to protect substrate member 230 from, for example, the surrounding plasma environment in space. Accordingly, cover 270 is configured to prevent substrate member 230 from receiving a charge and from becoming an unwanted source of a discharge. In the exemplary embodiment, cover 270 is substantially square-shaped, wherein each distance 278 between corners 279 of cover 270 are equal. For example, each distance 278 may be in a range of about 2 inches to 10 inches. Preferably, each distance 278 is approximately 3 inches. Accordingly, charge detection device 104 is relatively compact and has a relatively small physical footprint. Moreover, cover 270 includes a substantially square-shaped opening 271 such that dielectric member 206 can be exposed to the space environment.

In the exemplary embodiment, charge detection device 104 also includes a connector 280 that is coupled to substrate member 230. In the exemplary embodiment, connector 280 is configured to be an interface between charge detection device 104 and, for example, computing device 108 (shown in FIG. 1). More specifically, connector 280 is configured to channel signals received from processing unit 240 to computing device 108. Moreover, the seal formed between substrate member 230 and housing 242 enables many signals to be channeled from substrate member 230 to connector 280. Accordingly, feed-through pins (not shown) that require glass metal seals may no longer be necessary. Moreover, in the exemplary embodiment, connector 280 is configured to couple substrate member 230 to an external antenna (not shown in FIGS. 2 and 3), wherein the antenna may be configured to receive at least one signal that is representative of an electrostatic discharge from location of vessel 102 that is different from the location that base plate 208 receives a signal from.

Charge detection device 104, in the exemplary embodiment, may be coupled to surface 106 of vessel 102 via first fasteners 260. Moreover, charge detection device 104 may be electrically grounded to vessel 102 such that the induced electrostatic potential energy from dielectric member 206 is not disturbed. As such, installation of device 104 is relatively straightforward. Moreover, charge detection device 104 may be thermally coupled to vessel 102 such that heat dissipation from the components of device 104 maintains a substantially stable temperature. For example, heat dissipation from components (not shown in FIGS. 2 and 3) of processing unit 240 may facilitate the same stable temperature be maintained. Accordingly, thermal blankets (not shown) may not need to be used where device 104 is located.

During operation, electrons that are impinging on a surface of dielectric member 206 charge the capacitance formed by charge plate 202, dielectric member 206, and the plasma environment. When dielectric member 206 is charged, electrostatic potential energy is induced on charge plate 202. The induced electrostatic potential energy is channeled from charge plate 202 to base plate 208. In addition, base plate 208, which is also acting as a radio frequency antenna, may receive at least one signal that is representative of an electrostatic discharge from a different location of vessel 102. Signal(s) that are representative of the induced electrostatic potential energy and the electrostatic discharge are then channeled to substrate member 230. The signal(s) may then be transmitted to processing unit 240.

As described in more detail below, processing unit 240 generates at least one first output that is representative of a measurement for the induced electrostatic potential energy, and also generates at least one second output that is representative of the presence of the electrostatic discharge from the different location of vessel 102. Processing unit 240 may transmit signal(s) representative of the first and second outputs to connector 280 such that the signal(s) can be transmitted to computing device 108 (shown in FIG. 1) to display the first and second outputs to a user. For example, computing device 108 may provide a graphical and/or textual display to the user. The display of the outputs facilitates a correlation and analysis between the outputs such that a user is enabled to determine the presence of at least one hazardous charging condition for vessel 102. In addition, connector 280 may receive at least one signal from the external antenna, wherein the signal may be representative of an electrostatic discharge from another location of vessel 102. Connector 280 transmits that signal to base plate 208 and/or to substrate member 230 such that the signal may be transmitted to processing unit 240. Moreover, processing unit 240 would generate an output that is representative of the electrostatic discharge and processing unit 240 may transmit a signal representative of the output to computing device 108 for display.

Figure 4:
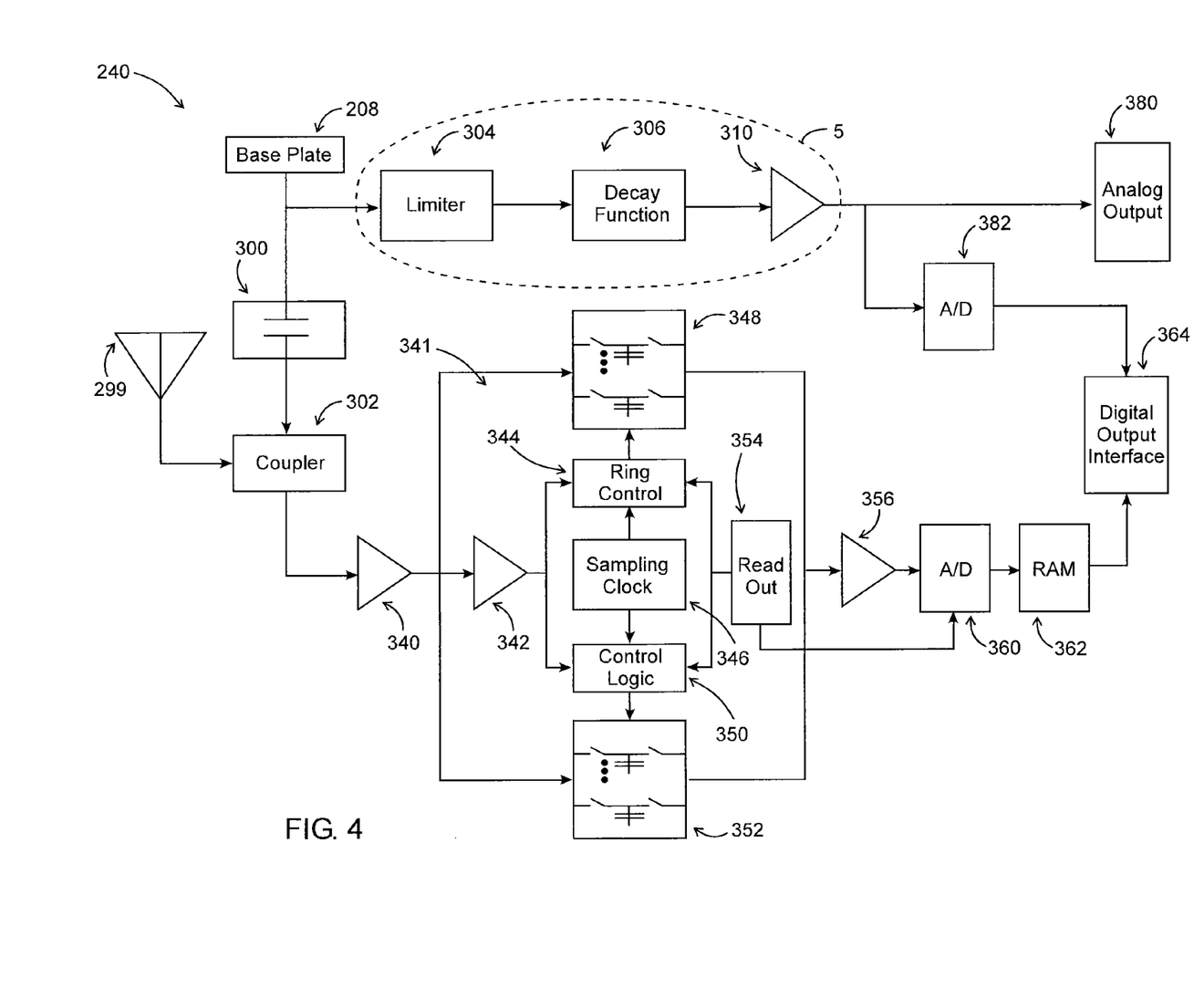
FIG. 4 is a block diagram of a portion of the charge detection device shown in FIG. 2.
Figure 5:
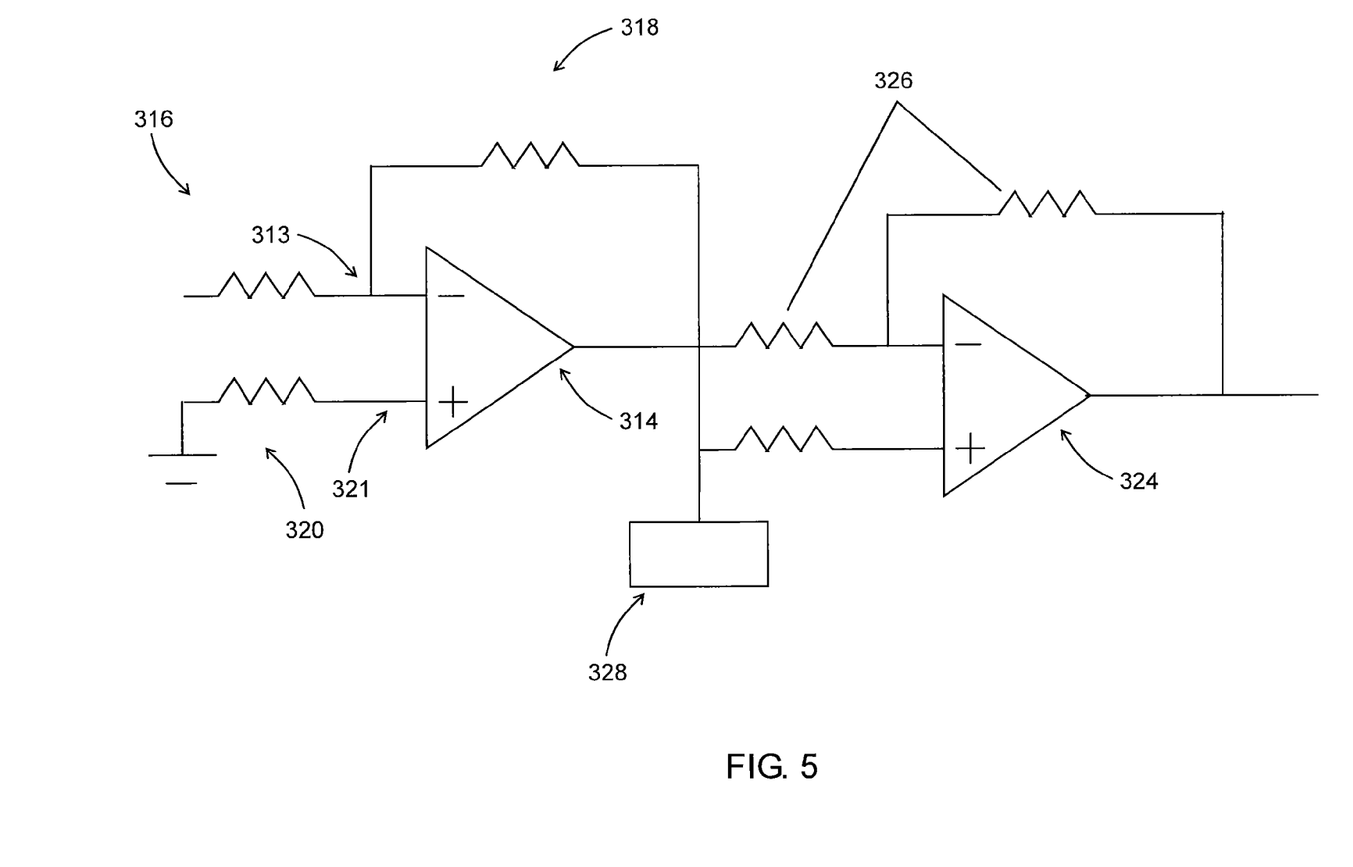
FIG. 5 is a block diagram of a portion of the charge detection device shown in FIG. 4 and taken from area 5.

FIG. 4 is a block diagram of processing unit 240. FIG. 5 is a block diagram of a portion of processing unit 240 taken from area 5 (shown in FIG. 4). Referring first to FIG. 4, in the exemplary embodiment, processing unit 240 includes a capacitor 300 that is coupled to an input, such as base plate 208 or an external antenna 299 that is coupled to processing unit 240 via connector 280 (shown in FIGS. 2 and 3). Moreover, in the exemplary embodiment, capacitor 300 is grounded through a coupler 302. More specifically, in the exemplary embodiment, coupler 302 may be either a pi-network or a T-network that is configured to provide the proper termination, attenuation, and filtering of alternating current (AC) transients for compatibility with, for example, adjacent components. Alternative, coupler 302 may be any type of coupler that enables device 104 and/or system 100 (shown in FIG. 1) to function as described herein. Moreover, in the exemplary embodiment, coupler 302 also forms a branch of a resistor-capacitor (RC) filter network, which is needed to establish a low and high threshold frequency. In the exemplary embodiment, the low and high threshold frequency is at or below the Nyquist frequency of half the sampling clock rate. More specifically, in the exemplary embodiment, the specifications include the following values: termination is approximately 50 ohms, low cutoff is approximately 60 kHz, high cutoff is approximately 150 MHz, and attenuation is approximately 10 dB. Such specifications are chosen for a transient sampling rate of 300 MHz. A limiter 304 is coupled to capacitor 300 and to a decay function 306. Processing unit 240 also includes an amplifier 310 that is coupled to decay function 306 and to an analog-to-digital converter (ADC) 382.

As illustrated in FIG. 5, the preferred circuit for limiter 304, decay function 306, and amplifier 310 uses two inverting Operational-amplifier (Op-amp) configurations. More specifically, a first Op-amp 314 is a junction gate field-effect transistor (jFET) input with low input bias currents, such as, for example, on the order of pico-amps. A substantially high value resistor 316 (preferably approximately 1 Gohm) is coupled to first Op-amp 314 at a first input 313 and to a substantially smaller feedback resistor 318 (preferably approximately 100 Megohms) An impedance matching resistor 320 is placed on a second input 321 to first Op-amp 314 to facilitate making the measurement insensitive to input offset currents.

Limiter 304, in the exemplary embodiment, is formed by resistor 316 to maintain the input current substantially low such that the circuitry and a protection diode (not shown) within first Op-amp 314 are protected. Decay function 306 is also formed by resistor 316 to set a time constant larger than the charging time of capacitor 300 on the order of approximately 50 nano-Farads. A second inverting Op-amp 324 is coupled to resistors 326 that have values chosen to scale the output over the voltage range of interest. In the exemplary embodiment, second Op-amp 324 is a rail-to-rail amplifier to achieve a suitable linear dynamic range. Alternatively, any suitable amplifier may be used that enables device 104 and/or system 100 (shown in FIG. 1) to function as described herein. Second Op-amp 324 is also coupled to a reference 328. In the exemplary embodiment, reference 328 is a stable voltage derived from a band-gap reference to offset the output so that positive and negative charging voltages can be measured and be compatible with unipolar analog-to-digital converters (not shown). As such, the output can be a voltage in the range of about 0 to 5 volts.

Referring to back to FIG. 4, coupler 302 is coupled to amplifier 340. In the exemplary embodiment, amplifier 340 is configured to serve as a unity-gain impedance buffer for a switched capacitor array (SCA) 341. In the exemplary embodiment, SCA 341 is formed by a comparator 342, a ring control 344, a sampling clock 346, a ring SCA 348, a first-in first-out (FIFO) control logic 350, a FIFO SCA 352, and a readout clock 354. SCA 341 provides a waveform transient recording function for a complete capture before and after the time at which the transient was detected. Readout clock 354 is coupled to an amplifier 356, and a substantially slow ADC 360 is coupled to amplifier 356. A Random Access Memory (RAM) 362 is coupled to ADC 360. A digital output interface 364 is coupled to RAM 362. In the exemplary embodiment, sampling clock 346 is configured to operate at a relatively higher rate compared to readout clock 354. Moreover, in the exemplary embodiment, sampling clock 346 operates at approximately 300 MHz while readout clock 354 runs at approximately 4.69 MHz. Alternatively, sampling clock 346 and/or readout clock 354 may operate under any suitable condition that enables device 104 and/or system 100 to function as described herein. In order for such a design to work properly, amplifier 340, comparator 342, ring control 344, sampling clock 346, ring SCA 348, FIFO control logic 350, FIFO SCA 352, and readout clock 354 are implemented with monolithic circuits to substantially limit parasitic capacitance and improve sampling speed.

Moreover, in the exemplary embodiment, amplifier 340, comparator 342, ring control 344, sampling clock 346, ring SCA 348, FIFO control logic 350, FIFO SCA 352, readout clock 354, amplifier 356, ADC 360, RAM 362, and at least a portion of digital output interface 364 form an application specific integrated circuit (ASIC). In the exemplary embodiment, there are sixteen capacitors (not shown) in ring SCA 348 for a pre-trigger of signal acquisition and FIFO SCA 354 has 128 capacitors (not shown) for a post-trigger of signal acquisition. Alternatively, ring SCA 348 and FIFO SCA 352 may have any number of capacitors that enable device 104 and/or system 100 to function as described herein. Moreover, the size and shape of both SCA 348 and FIFO SCA 352 may be any suitable size and shape so long as the amount of silicon area provided on the ASIC is suitable to enable device 104 and/or system 100 to function as described herein. While ring SCA 348 and FIFO SCA 352 includes a linear spacing, the sample spacing is not limited to linear spacing. For example, a logarithmic spacing can be implemented by the logic (not shown) in ring control 344 and FIFO control logic 350 for applications in high temporal resolution at an event onset while at the same time capturing the duration of a transient with lesser resolution.

During operation, with regard to obtaining a measurement for the induced electrostatic potential energy from dielectric member 206 (shown in FIGS. 2 and 3), electrons impinging the surface of dielectric member 206 charge the capacitance formed by charge plate 202 (shown in FIGS. 2 and 3), dielectric member 206, and the plasma environment. As dielectric member 206 charges, an image charge forms on charge plate 202 (shown in FIGS. 2 and 3) and/or base plate 208 (shown in FIG. 3) and is collected by capacitor 316. During abrupt changes in the charging environment, the voltage at the input to limiter 304 is determined by the capacitive divider formed by capacitor 300 and dielectric member 206 to the plasma or space environment. Under steady state conditions, whereby the charging source is a constant rate of current, the voltage at the input to amplifier 310 will be determined by the resistive divider of the network formed by resistor 316 and the resistivity of the dielectric member 206. In the exemplary embodiment, while dielectric member 206 can charge to, for example, several thousand volts, the voltage on capacitor 300 is approximately 25 volts due to charge division. Limiter 304 attenuates the signal further and prevents the input voltage to the rest of the electronics from exceeding their safe operating level. Decay function 306 sets a sixty second time constant, relative to the charging rate, for the slow decay of the charge stored in capacitor 300 from the charging of charge plate 202 and/or base plate 208. Without the decay function 306, charge plate 202 and/or base plate 208 would continue to charge up until the point of breakdown, which may be undesired. Amplifier 310 provides a high impedance buffer to the charging signal and scales an output voltage that is proportional to the voltage on capacitor 300. The DC charging-level signal is then provided as an analog output 380 or can be digitized by ADC 382 for subsequent processing.

Moreover, in the exemplary embodiment, resistor 316 on input 313 to the first stage converts the input voltage to a current which is channeled through a resistor 320 to scale down the output. An impedance matching resistor 320 is placed on the other input 321 to first Op-amp 314 to make the measurement insensitive to input offset currents.

With regard to the electrostatic discharge from a second location of vessel 102 (shown in FIG. 1), processing unit 240 records the presence of the electrostatic discharge by converting voltage transients that are present on base plate 208 or on external antenna 299 to digital format. In the exemplary embodiment, coupler 302 provides the proper termination, attenuation, and filtering of the AC transients for compatibility with the other components of processing unit 240. For example, termination may be needed for grounding capacitor 300 to obtain the measurement for the induced electrostatic potential energy from dielectric member 206 as well as for providing a matched impedance to prevent high frequency signal reflections. The attenuation may be needed to scale the expected voltage transients down to the desired peak-to-peak voltage swing. The signal from coupler 302 is transmitted to amplifier 340.

In the exemplary embodiment, SCA 341 provides a waveform transient recording function for a complete capture before and after the time at which the transient was detected. More specifically, the output of amplifier 340 is transmitted to ring SCA 348, which serves as a pre-trigger analog memory. For example, in the exemplary embodiment, an array of capacitors (not shown) for ring SCA 348 are successively switched into the input signal from amplifier 340 by ring control logic 344 and sampling clock 346. As a result, the voltage on the array of capacitors samples a portion of the input voltage. Sampling continues in a substantially circular fashion until comparator 342 senses a threshold-crossing of the input voltage from amplifier 340. A programmable threshold is input to comparator 342 to make it respond to both positive and negative voltage levels. The signal from comparator 342 is received by both ring control logic 344 and FIFO control logic 350. When the ring control logic 344 receives comparator signal, it disables further sampling of ring SCA 348. This constitutes the waveform prior to threshold detection by comparator 342. At the same time, FIFO control logic 350 transmits signals to FIFO SCA 352 to successively sample the input waveform from amplifier 340 on its array of capacitors.

FIFO control logic 350 terminates the acquisition of new samples from amplifier 340 when all the capacitors in FIFO SCA 352 have been activated one time. This constitutes the waveform after threshold detection. When FIFO control logic 350 has signaled all capacitors in FIFO SCA 352, readout clock 354 provides a relatively slower clock compared to ring control 344 and FIFO control logic 350. This operation causes the output switches on each of the capacitors in ring SCA 348 to successively switch into the input of amplifier 356. The buffered signal from amplifier 356 is transmitted to ADC 360, which is synchronized by readout clock 354. The output of ADC 360 is written to RAM 362. Digital output interface 364 provides either a serial or parallel access to RAM 362 for downloading of the transient waveform to, for example, computing device 108 (shown in FIG. 1). In the exemplary embodiment, the digital output is transmitted to computing device 108 using a standard low voltage differential signal (LVDS) communication interface.

As compared to known monitoring systems that monitor electrostatic charges, the above-described monitoring system enables the use of a single instrument or apparatus to both monitor the charging environment relative to a vessel and to record electrostatic discharge events. More specifically, the exemplary monitoring system includes a charge detection device that can couple to a surface of a vessel. The charge detection device is configured to measure an induced electrostatic potential energy from a dielectric member that is representative of at least one material used on the vessel, while also being able to determine the presence of an electrostatic discharge from a different location on the vessel. The charge detection device is also configured to generate at least one first output that is representative of the measurement for the induced electrostatic potential energy and at least one second output that is representative of the presence of the electrostatic discharge to facilitate a correlation between the first and second outputs such that a user is enabled to determine the presence of at least one hazardous charging condition on the vessel. Accordingly, both a detection of electrostatic discharge transients and an identification of a source or type of electromagnetic interference are facilitated by the charge detection device. Moreover, the charge detection device is physically smaller than known detection devices and can be easily coupled to, and/or removed from, the vessel.

Exemplary embodiments of the systems and methods are described above in detail. The systems, and methods are not limited to the specific embodiments described herein, but rather, components of the systems and/or steps of the method may be utilized independently and separately from other components and/or steps described herein. For example, the system may also be used in combination with other systems and methods, and is not limited to practice with only a monitoring system as described herein. Rather, the exemplary embodiment can be implemented and utilized in connection with many other systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A charge detection device comprising:
   a dielectric member that is representative of at least one material on a first location of a vessel, said dielectric member is configured to induce electrostatic potential energy when said dielectric member is charged;
   a base plate coupled to said dielectric member, wherein said base plate is configured to channel the induced electrostatic potential energy through at least a portion of said charge detection device, said base plate is further configured to receive at least one signal that is representative of an electrostatic discharge from a second location of the vessel; and
   a processing unit coupled to said base plate, wherein said processing unit is configured to generate at least one first output that is representative of a measurement for the induced electrostatic potential energy, said processing unit is further configured to generate at least one second output that is representative of the presence of the electrostatic discharge from the second location to facilitate a correlation between the at least one first output and the at least one second output such that a user is enabled to determine the presence of at least one hazardous charging condition on the vessel.

2. A charge detection device in accordance with claim 1, further comprising a charge plate coupled to said base plate, said dielectric member is adhered to at least a portion of said charge plate.

3. A charge detection device in accordance with claim 1, further comprising a substrate member coupled to said base plate and to said processing unit, wherein said substrate member comprises a gold-plated ceramic material and said substrate member is configured to receive the induced electrostatic potential energy from said base plate and transmit at least one signal representative of the induced electrostatic potential energy to said processing unit, said substrate member is further configured to provide electrical isolation between said base plate and the vessel.

4. A charge detection device in accordance with claim 3, further comprising a connector coupled to said substrate member, wherein said connector is configured to couple said substrate member to an antenna that is configured to receive at least one signal that is representative of an electrostatic discharge from a third location of the vessel.

5. A charge detection device in accordance with claim 1, further comprising a housing to enclose said processing unit therein, wherein said housing is configured to provide a dry gas seal to prevent contamination of said processing unit.

6. A charge detection device in accordance with claim 1, wherein said processing unit comprises an analog-to-digital converter that is configured to generate at least one of the at least one first output and the at least one second output.

7. A charge detection device in accordance with claim 1, wherein said processing unit further comprises a switched capacitor array configured to receive voltage samples of the at least one signal that is representative of the electrostatic discharge to facilitate a sequential transmission of the voltage samples to a converter.

8. A charge detection device in accordance with claim 7, wherein said switched capacitor array is further configured to facilitate a sampling of the at least one signal that is representative of the electrostatic discharge.

9. A monitoring system comprising:
   a vessel;
   a charge detection device coupled to a surface of said vessel, wherein said charge detection device comprises:
      a dielectric member that is representative of at least one material on a first location of said vessel, said dielectric member is configured to induce electrostatic potential energy when said dielectric member is charged;
      a base plate coupled to said dielectric member, wherein said base plate is configured to channel the induced electrostatic potential energy through at least a portion of said charge detection device, said base plate is further configured to receive at least one signal that is representative of an electrostatic discharge from a second location of said vessel; and
      a processing unit coupled to said base plate, wherein said processing unit is configured to generate at least one first output that is representative of a measurement for the induced electrostatic potential energy, said processing unit is further configured to generate at least one second output that is representative of the presence of the electrostatic discharge from the second location to facilitate a correlation between the at least one first output and the at least one second output such that a user is enabled to determine the presence of at least one hazardous charging condition on said vessel; and
   a computing device coupled to said charge detection device, wherein said computing device comprises a presentation interface to display the at least one first output and the at least one second output to the user.

10. A monitoring system in accordance with claim 9, wherein said charge detection device further comprises a charge plate coupled to said base plate, said dielectric member is adhered to at least a portion of said charge plate.

11. A monitoring system in accordance with claim 9, wherein said charge detection device further comprises a substrate member coupled to said base plate and to said processing unit, wherein said substrate member comprises a gold-plated ceramic material and said substrate member is configured to receive the induced electrostatic potential energy from said base plate and transmit at least one signal representative of the induced electrostatic potential energy to said processing unit, said substrate member is further configured to provide electrical isolation between said base plate and the vessel.

12. A monitoring system in accordance with claim 11, wherein said charge detection device further comprises a connector coupled to said substrate member, wherein said connector is configured to couple said substrate member to an antenna that is configured to receive at least one signal that is representative of an electrostatic discharge from a third location of said vessel.

13. A monitoring system in accordance with claim 9, wherein said charge detection device further comprises a housing to enclose said processing unit therein, wherein said housing is configured to provide a dry gas seal to prevent contamination of said processing unit.

14. A monitoring system in accordance with claim 9, wherein said processing unit comprises an analog-to-digital converter that is configured to generate at least one of the at least one first output and the at least one second output.

15. A monitoring system in accordance with claim 9, wherein said charge detection device is at least one of electrically grounded and thermally tied to said vessel.

16. A method for determining hazardous charging conditions, said method comprising:
   inducing electrostatic potential energy on a dielectric member that is representative of at least one material on a first location of a vessel;
   channeling the induced electrostatic potential energy through a base plate that is coupled to the dielectric member;
   receiving, via the base plate, at least one signal that is representative of an electrostatic discharge from a second location of the vessel;
   generating at least one first output that is representative of a measurement for the induced electrostatic potential energy via a processing unit;
   generating at least one second output that is representative of the presence of the electrostatic discharge from the second location via the processing unit; and
   using a correlation between the at least one first output and the at least one second output to determine the presence of at least one hazardous charging condition on the vessel.

17. A method in accordance with claim 16, wherein inducing an electrostatic potential energy further comprises inducing an electrostatic potential energy on a dielectric member that is adhered to a charge plate.

18. A method in accordance with claim 16, further comprising:
   channeling the induced electrostatic potential energy and the at least one signal that is representative of the electrostatic discharge from the base plate to a substrate member; and
   transmitting at least one signal representative of the induced electrostatic potential energy and the electrostatic discharge from the substrate member to the processing unit.

19. A method in accordance with claim 18, further comprising receiving at least one signal that is representative of an electrostatic discharge from a third location via an antenna that is coupled to the substrate member with a connector.

20. A method in accordance with claim 16, further comprising digitizing at least one of a signal representative of the induced electrostatic potential energy and the at least one signal that is representative of the electrostatic discharge from the second location via an analog-to-digital converter.

* * * * *